(12) United States Patent
Liu et al.

(10) Patent No.: US 8,115,208 B2
(45) Date of Patent: Feb. 14, 2012

(54) IMAGE DISPLAY SYSTEM AND MANUFACTURING METHOD THEREOF

(75) Inventors: Yu-chung Liu, Chu-Nan (TW); Te-yu Lee, Chu-Nan (TW)

(73) Assignee: Chimei Innolux Corporation (TW)

( * ) Notice: Subject to any disclaimer, the term of this patent is extended or adjusted under 35 U.S.C. 154(b) by 363 days.

(21) Appl. No.: 12/432,510

(22) Filed: Apr. 29, 2009

(65) Prior Publication Data

US 2009/0272978 A1  Nov. 5, 2009

(30) Foreign Application Priority Data

Apr. 30, 2008 (TW) ............................. 97116022 A

(51) Int. Cl.
  *H01L 27/14* (2006.01)
  *H01L 29/04* (2006.01)
  *H01L 29/15* (2006.01)
  *H01L 31/036* (2006.01)
(52) U.S. Cl. ............ 257/72; 257/59; 257/E27.133; 438/782; 438/197; 438/584
(58) Field of Classification Search .......... 257/59, 257/67, 72, E27.133; 438/782, 197, 584, 438/763, 149
  See application file for complete search history.

(56) References Cited

U.S. PATENT DOCUMENTS

| | | | |
|---|---|---|---|
| 7,166,863 B2 * | 1/2007 | Yamazaki et al. | 257/72 |
| 7,259,110 B2 * | 8/2007 | Ohnuma et al. | 438/782 |
| 7,405,033 B2 * | 7/2008 | Yamazaki et al. | 430/311 |
| 7,491,590 B2 * | 2/2009 | Maekawa | 438/158 |
| 7,582,904 B2 * | 9/2009 | Fujii et al. | 257/72 |
| 7,615,488 B2 * | 11/2009 | Maekawa et al. | 438/674 |
| 7,635,889 B2 * | 12/2009 | Isa et al. | 257/309 |
| 7,642,038 B2 * | 1/2010 | Fujii | 430/311 |
| 7,655,566 B2 * | 2/2010 | Fujii | 438/678 |
| 7,687,326 B2 * | 3/2010 | Morisue et al. | 438/149 |
| 7,727,847 B2 * | 6/2010 | Tanaka et al. | 438/314 |
| 7,732,330 B2 * | 6/2010 | Fujii | 438/678 |
| 7,768,617 B2 * | 8/2010 | Yamazaki et al. | 349/147 |
| 7,807,483 B2 * | 10/2010 | Yamazaki et al. | 438/29 |

* cited by examiner

*Primary Examiner* — Zandra Smith
*Assistant Examiner* — Telly Green
(74) *Attorney, Agent, or Firm* — Lowe Hauptman Ham & Berner, LLP

(57) ABSTRACT

An image display system and manufacturing method are disclosed. According to the present invention, the image display system comprises a substrate, a switching TFT, a driving TFT, a photo sensor and a capacitor. A buffer layer is formed on a substrate. A separation layer is formed in a first area for forming a switching TFT, but no heat sink layer is formed thereon. A heat sink layer is formed on a second area for forming the driving TFT, the photo sensor and the capacitor, and then, the separation layer is formed thereafter. The present invention can form poly silicon layers with different crystal grain sizes on the first area and on the second area in a single laser crystallization process by utilizing the heat sink phenomenon of ELA with or without the heat sink layer. Therefore, the image display system of the present invention can operate with good luminance uniformity.

11 Claims, 4 Drawing Sheets

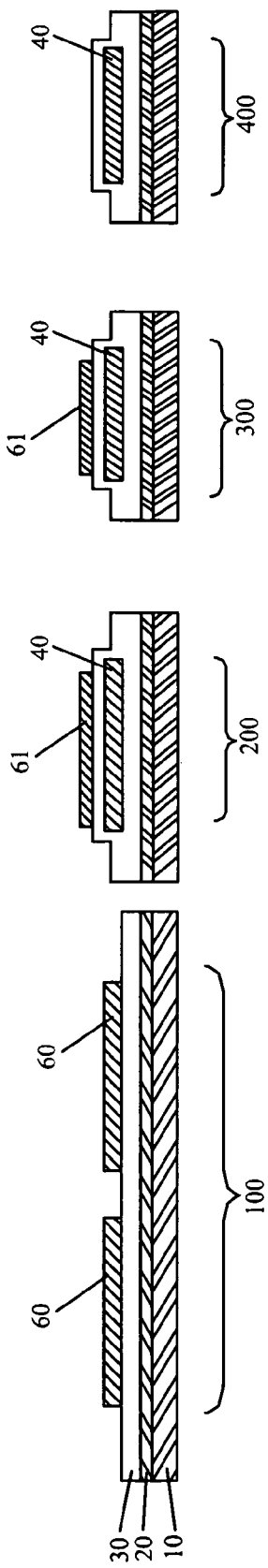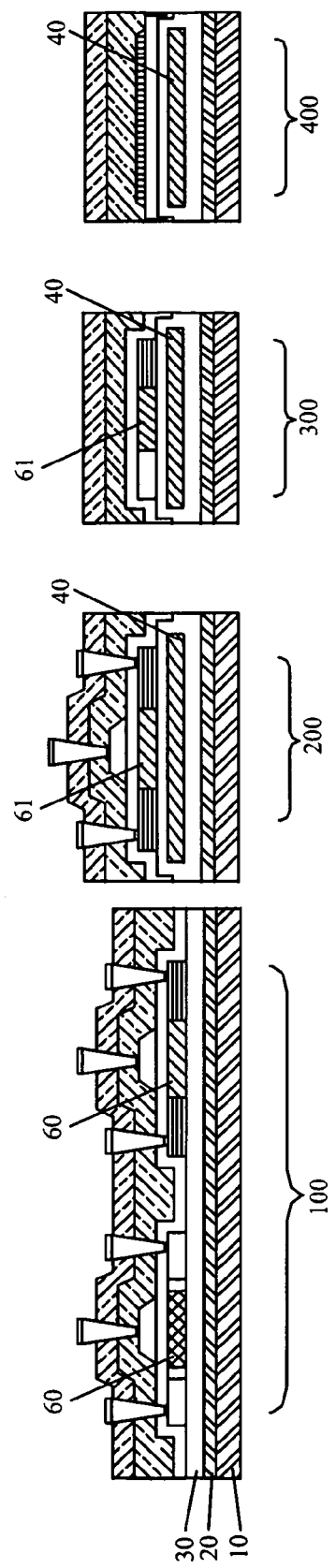
FIG. 3c
FIG. 3d

IMAGE DISPLAY SYSTEM AND MANUFACTURING METHOD THEREOF

RELATED APPLICATIONS

The present application is based on, and claims priority from, Taiwan Application Number 097116022, filed Apr. 30, 2008, the disclosure of which is hereby incorporated by reference herein in its entirety.

BACKGROUND OF THE INVENTION

1. Field of the Invention

The present invention generally relates to an image display system and manufacturing method thereof, and more particularly to an AMOLED (Active Matrix Organic Light Emitting Diode) circuit and manufacturing method thereof.

2. Description of Prior Art

An OLED (Organic Light Emitting Diode) display is generally acknowledged as the next generation technology for the flat panel display, in which an AMOLED (Active Matrix Organic Light Emitting Diode) display is especially concerned. The related manufacturing industries are committing enormous resources to develop such AMOLED products. A pixel unit of the AMOLED display includes a driving TFT (Thin Film Transistor), a switching TFT, a luminous element (i.e. OLED element) and a capacitor. As manufacturing the aforesaid elements of the AMOLED, an ELA (Excimer Laser Anneal) is employed to transform an amorphous silicon layer into a poly silicon layer.

Different demands of electrical characteristics exist for the driving TFT of a driving circuit for driving the luminous element (e.g. OLED element) and the switching TFT. For example, A high mobility is preferred for the switching TFT while the driving TFT is preferred to have a small crystal grain size so as to reduce discrepancies among the respective luminous elements (OLED elements), that is, to reduce the mura issue caused by the non-uniformity among transistors. Therefore, it is preferable that the poly silicon layers having different crystal grain characteristics are formed on different areas during the crystallization processes of transforming the aforesaid amorphous silicon layer into the poly silicon layers.

In related manufacturing industries today, different crystallizations in different processes are now being utilized to achieve the aforesaid objective. For example, a laser crystallization process such as ELA (Excimer Laser Anneal) and a non-laser crystallization process such as SPC (Solid Phase Crystallization), MIC (Metal Induced Crystallization), MILC (Metal Induced Lateral Crystallization), FE-MILC (Field Enhanced Metal Induced Lateral Crystallization), or the like can be used.

However, the method of employing the aforesaid different crystallizations in the different processes takes more time and is quite complicated in comparison to a single laser crystallization process. Therefore, it is still difficult to increase the yield. Moreover, the poly silicon layers formed by aforesaid different crystallization processes show apparent discrepancies of the crystal grain characteristics. The present invention is intended to solve the low yield problem of the AMOLED products because of the mura issue caused by the discrepancies among the respective luminous elements (OLED elements).

SUMMARY OF THE INVENTION

An objective of the present invention is to provide an image display system and manufacturing method thereof for forming poly silicon layers with different crystal grain sizes on a first area and a second area in a single laser crystallization process. By doing so, the present invention solves a mura issue caused by forming the poly silicon layers by ELA (Excimer Laser Anneal). Accordingly, the image display system of the present invention can operate with good luminance uniformity.

Another objective of the present invention is to provide an image display system and manufacturing method thereof to increase the luminous sensitivity of a photo sensor.

Another objective of the present invention is to provide an image display system and manufacturing method thereof to decrease an occupied area of a capacitor and to increase an aperture ratio of the image display system.

The image display system of the present invention comprises a substrate, a switching TFT and a driving TFT. The substrate has a first area and a second area. The switching TFT is positioned on the first area and has a first poly silicon layer. The driving TFT is positioned on the second area and has a second poly silicon layer and a heat sink layer. There is a separation layer provided between the second poly silicon layer and the heat sink layer. A photo sensor and a capacitor can also be formed on the second area. The first poly silicon layer and the second poly silicon layer have different crystal grain characteristics.

The manufacturing method of the image display system according to the present invention comprises steps as follows: providing a substrate; forming a buffer layer on a first area and a second area of the substrate; forming a heat sink layer on the buffer layer of the second area; forming a separation layer on the heat sink layer of the second area; forming an amorphous silicon layer on the buffer layer of the first area and on the heat sink layer of the second area; transforming the amorphous silicon layer of the first area and the amorphous silicon layer of the second area into a first poly silicon layer and a second poly silicon layer with different crystal grain characteristics by a crystallization process; forming a switching TFT having the first poly silicon layer on the first area; and forming a driving TFT having the second poly silicon layer on the second area.

The crystal grain size of the first poly silicon layer is larger than that of the second poly silicon layer. The mobility of the first poly silicon layer is higher than that of the second poly silicon layer. The heat sink layer for the photo sensor is employed to reflect light irradiating on the photo sensor to increase the luminous sensitivity of the photo sensor. The heat sink layer of the capacitor can be an electrode thereof and connected therewith in parallel to decrease the occupied area of the capacitor for increasing the aperture ratio of the image display system.

BRIEF DESCRIPTION OF THE DRAWINGS

FIG. 3a to FIG. 3d illustrate sectional diagrams of steps of a manufacturing method according to the present invention.

DETAILED DESCRIPTION OF THE INVENTION

Figure 1:
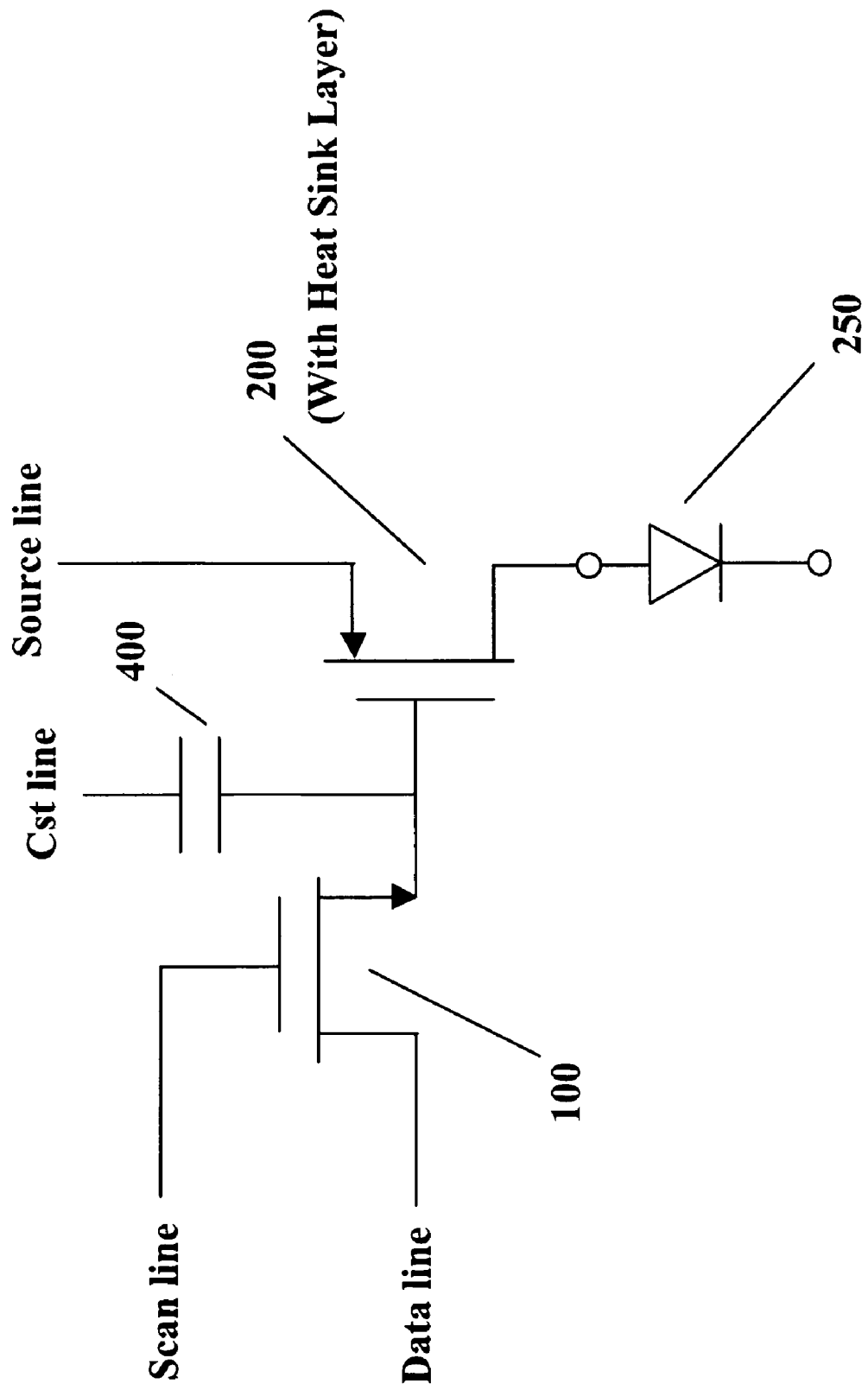
FIG. 1 depicts a simple structure of an AMOLED (Active Matrix Organic Light Emitting Diode) structure.

Please refer to FIG. 1, which depicts a simple structure of an AMOLED (Active Matrix Organic Light Emitting Diode)

structure. A pixel unit of the AMOLED includes a switching TFT 100, a driving TFT 200, a luminous element 250 and a capacitor 400.

As aforementioned, different demands of the electrical characteristics exist for the switching TFT 100 and the driving TFT 200. The switching TFT 100 is required to have a low sub-threshold swing value and high mobility. The driving TFT 200 is required to have a high sub-threshold swing value and uniformity among transistors for the benefit of transmitting the conductive current of driving the luminous element 250. The driving current is very sensitive to the discrepancies among the respective luminous elements 250 of the respective pixel units. The discrepancies among the luminous elements 250 may cause the mura phenomenon. Therefore, by forming poly silicon layers with different crystal grain structures or different crystal grain sizes for the switching TFT 100 positioned on a first area and for the driving TFT 200, the luminous element 250 and the capacitor 400 positioned on a second area, the aforesaid demands of the electrical characteristics can be satisfied. According to the present invention, by utilizing a heat sink layer formed on the second area and the heat sink phenomenon of ELA (Excimer Laser Anneal), the poly silicon layers with different crystal grain structures or different crystal grain sizes can be formed on the first and second areas in a single crystallization process.

Figure 2A:
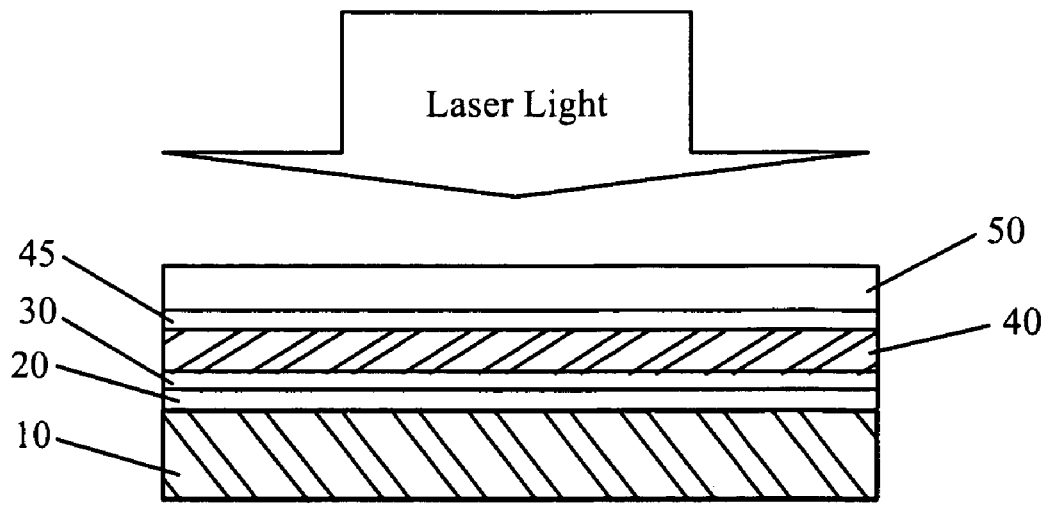
FIG. 2a to FIG. 2c illustrate diagrams of forming a poly silicon layer with small crystal grain size by employing a heat sink phenomenon according to the present invention.
Figure 2B:
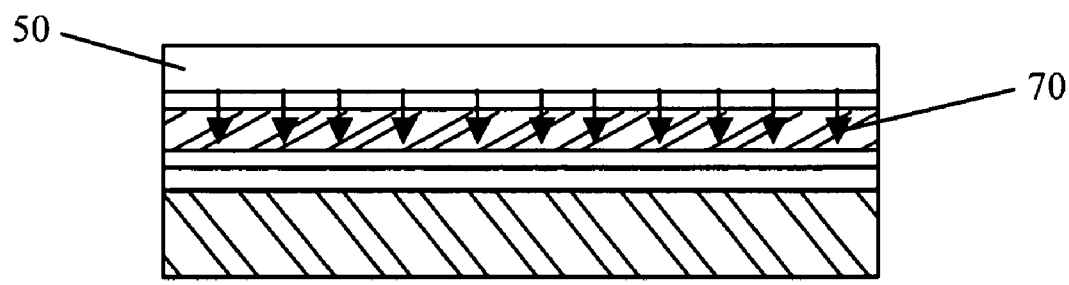
Figure 2C:
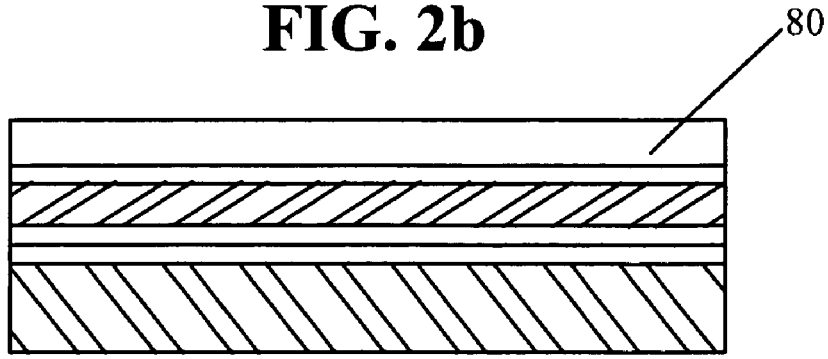

Please refer to FIG. 2a to FIG. 2c, which illustrate diagrams of forming a poly silicon layer with small crystal grain size by employing a heat sink phenomenon according to the present invention. As shown in FIG. 2a, at least one buffer layer 20 or 30 is firstly formed on a substrate. The buffer layer 20 or 30 can be made of oxide or nitride, such as, silica or silicon nitride. A heat sink layer 40 is formed before deposition of an amorphous silicon layer 50 for crystallization. Generally, metal material can be chosen to form the heat sink layer 40 for achieving good heat conduction. And then, a separation oxide layer 45 and successively the amorphous silicon layer are formed. The amorphous silicon layer 50 is irradiated by laser (e.g. Excimer Laser Anneal) for proceeding the crystallization process to transform the amorphous silicon layer 50 into a poly silicon layer 80.

As shown in FIG. 2b, when the amorphous silicon layer 50 is annealed, the heat sink layer 40 conducts the heat as indicated by the heat flow 70 shown in FIG. 2b. As shown in FIG. 2c, the amorphous silicon layer 50 is transformed into a poly silicon layer 80, of which the crystal grain size is smaller than that in a case in which the heat sink layer 40 does not exist.

Figure 3A:
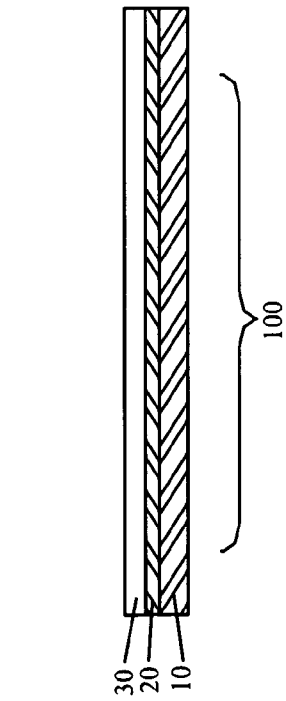
Figure 3A:
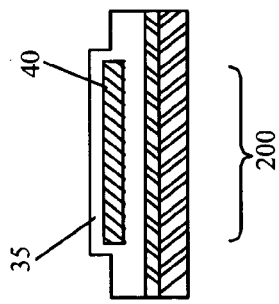
Figure 3A:
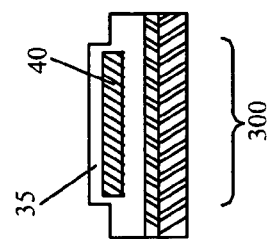
Figure 3A:
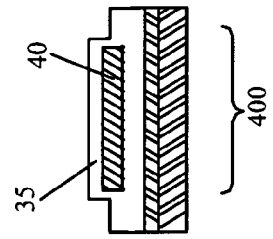

Please refer to FIG. 3a to FIG. 3d, which illustrate sectional diagrams of steps of a manufacturing method according to the present invention. As shown in FIG. 3a, an OLED display is illustrated as an example. To manufacture a switching TFT 100, a driving TFT 200, a photo sensor 300 and a capacitor (Cst) 400 of the OLED display, a substrate 10 having a first area and a second area is provided. The switching TFT 100 is positioned on the first area. The driving TFT 200, the photo sensor 300 and the capacitor 400 are positioned on the second area.

At least one buffer layer 20 is formed on the substrate 10. A buffer layer 20 can be a nitride layer, such as a silicon nitride. Another buffer layer 30 can be an oxide layer, such as silica. In this embodiment of the present invention, a heat sink layer 40 can be formed on the buffer layer 30 of the driving TFT 200, the photo sensor 300 and the capacitor 400 on the second area. A metal material can be chosen to form the heat sink layer 40, such as molybdenum or molybdenum alloy. Next, a further buffer layer 35 is formed on the heat sink layer 40. The material of the buffer layer 35 can be silica as the same as the buffer layer 30. Then, the buffer layer 30 and the buffer layer 35 cover the heat sink layer 40 on the second area as shown in FIG. 3a.

Figure 3B:
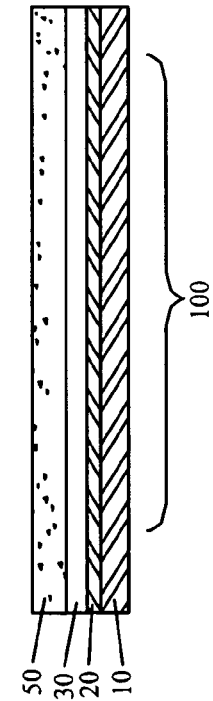
Figure 3B:
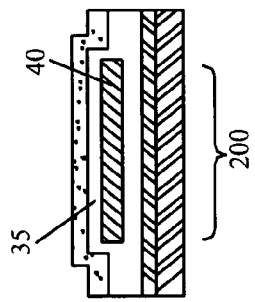
Figure 3B:
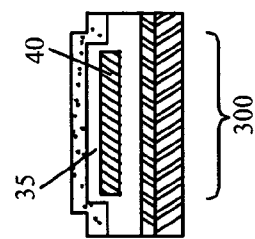
Figure 3B:
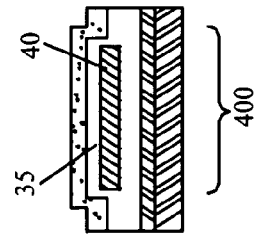

Next, as shown in FIG. 3b, an amorphous silicon layer 50 is formed to cover the buffer layer 30 and the buffer layer 35. The amorphous silicon layer 50 is then transformed into a poly silicon layer by ELA (Excimer Laser Anneal). Meanwhile, the poly silicon layer is patterned to form a first poly silicon layer 60 on the first area and a second poly silicon layer 61 on the second area as shown in FIG. 3c. The heat sink layer 40 is formed in advance on the second area where the driving TFT 200, the photo sensor 300 and the capacitor 400 are formed, the heat sink phenomenon occurs on the second area during the crystallization process for transforming the amorphous silicon layer 50 into the first poly silicon layer 60 and the second poly silicon layer 61 by ELA. In addition, the heat sink layer 40 is not formed on the first area where the switching TFT 100 are formed. Accordingly, the first poly silicon layer 60 on the first area and the second poly silicon layer 61 on the second area have different crystal grain sizes. Thereafter, with subsequent processes, the complete switching TFT 100, the complete driving TFT 200, the complete photo sensor 300 and the complete capacitor (Cst) 400 are manufactured as shown in FIG. 3d.

The first poly silicon layer 60 is employed for manufacturing the switching TFT 100 and the second poly silicon layer 61 is employed for manufacturing the driving TFT 200. The crystal grain size of the first poly silicon layer 60 is larger than that of the second poly silicon layer 61, and the mobility of the first poly silicon layer 60 is higher than that of the second poly silicon layer 61. The high mobility demand for the switching TFT 100 and the small crystal grain size demand for the driving TFT 200 can be satisfied. Therefore, the mura issue caused by the non-uniformity among the plural driving TFT 200 can be reduced.

Furthermore, the heat sink layer 40, which is positioned in correspondence to the photo sensor 300, can be employed for reflecting light irradiating on the photo sensor 300 to increase the luminous sensitivity of the photo sensor 300. The heat sink layer 40, which is positioned in correspondence to the capacitor 400 can be employed as an electrode of the capacitor 400 and is connected with the capacitor 400 in parallel. Therefore, the occupied area of the capacitor 400 can be decreased to increase the aperture ratio of OLED display of the present invention.

Consequently, the poly silicon layers with different crystal grain sizes on the first area and the second area can be formed in a single laser crystallization process according to the present invention. By doing so, the present invention can solve the mura issue caused by forming the poly silicon layers with ELA. Therefore, the OLED display can acquire good luminance uniformity. Moreover, the luminous sensitivity of the photo sensor can be increased and the occupied area of the capacitor can be decreased, i.e. the aperture ratio of OLED display can be increased. Furthermore, the image display system of the present invention can be employed in a mobile phone, a digital camera, a personal digital assistance, a notebook, a laptop computer, a television, an in-vehicle display, a global positioning system, a flight display, a digital photo frame or a portable DVD player.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An image display system, comprising:
   a substrate having a first area and a second area;
   a switching thin film transistor (TFT) positioned on the first area and having a first poly silicon layer; and
   a driving TFT positioned on the second area and having a second poly silicon layer, a heat sink layer and a separation layer between the second poly silicon layer and the heat sink layer,
   wherein the first poly silicon layer and the second poly silicon layer have different crystal grain characteristics.

2. The image display system of claim 1, wherein the switching TFT comprises a buffer layer formed on the substrate and the first poly silicon layer formed on the buffer layer; and the driving TFT comprises the buffer layer formed on the substrate, the heat sink layer formed on the buffer layer, the separation layer formed on the heat sink layer and the second poly silicon layer formed on the separation layer.

3. The image display system of claim 1, wherein the first poly silicon layer and the second poly silicon layer have different crystal grain structures.

4. The image display system of claim 1, wherein a crystal grain size of the first poly silicon layer is larger than that of the second poly silicon layer.

5. The image display system of claim 1, wherein a mobility of the first poly silicon layer is higher than that of the second poly silicon layer.

6. The image display system of claim 1, further comprising a photo sensor positioned on the second area of the substrate and having the second poly silicon layer, wherein the heat sink layer is employed to reflect light irradiating on the photo sensor.

7. The image display system of claim 1, further comprising a capacitor positioned on the second area of the substrate, wherein the heat sink layer is employed as an electrode of the capacitor.

8. The image display system of claim 7, wherein the heat sink layer is connected with the capacitor in parallel.

9. The image display system of claim 1, wherein the heat sink layer is a metal layer.

10. The image display system of claim 9, wherein the metal layer is a molybdenum layer or a molybdenum alloy layer.

11. The image display system of claim 1, wherein the image display system is employed in a mobile phone, a digital camera, a personal digital assistance, a notebook, a laptop computer, a television, an in-vehicle display, a global positioning system, a flight display, a digital photo frame or a portable DVD player.

* * * * *